United States Patent [19]
Schulthess et al.

[11] Patent Number: 5,783,358
[45] Date of Patent: Jul. 21, 1998

[54] STABILIZATION OF LIQUID RADIATION-CURABLE COMPOSITIONS AGAINST UNDESIRED PREMATURE POLYMERIZATION

[75] Inventors: Adrian Schulthess, Tentlingen; Bettina Steinmann, Praroman; Manfred Hofmann, Marly, all of Switzerland

[73] Assignee: Ciba Specialty Chemicals Corporation, Tarrytown, N.Y.

[21] Appl. No.: 611,914

[22] Filed: Mar. 6, 1996

[51] Int. Cl.$^6$ .............. G03C 9/08; G03F 7/029; G03F 7/031; C08G 59/68

[52] U.S. Cl. .............. 430/269; 430/280.1; 522/170; 522/182; 522/31; 522/66; 522/90; 522/100

[58] Field of Search .................. 522/113, 129, 522/120, 121, 170, 182, 31, 66, 90, 100; 430/269, 280.1

[56] References Cited

U.S. PATENT DOCUMENTS

| | | | |
|---|---|---|---|
| 3,708,296 | 1/1973 | Schlesinger | 96/33 |
| 4,339,567 | 7/1982 | Green et al. | 528/102 |
| 4,383,025 | 5/1983 | Green et al. | 430/280 |
| 4,398,014 | 8/1983 | Green et al. | 528/89 |
| 4,536,604 | 8/1985 | Lin et al. | 585/601 |
| 4,575,330 | 3/1986 | Hull | 425/174.4 |
| 4,624,912 | 11/1986 | Zweifel et al. | 430/258 |
| 4,751,102 | 6/1988 | Adair et al. | 427/53.1 |
| 4,772,530 | 9/1988 | Gottschalk et al. | 430/138 |
| 4,772,541 | 9/1988 | Gottschalk et al. | 430/339 |
| 4,868,288 | 9/1989 | Meier | 534/15 |
| 5,073,476 | 12/1991 | Meier et al. | 430/280 |
| 5,350,714 | 9/1994 | Trefonas, III et al. | 437/229 |
| 5,350,715 | 9/1994 | Lee | 437/250 |
| 5,378,802 | 1/1995 | Honda | 528/480 |
| 5,476,748 | 12/1995 | Steinmann et al. | 430/269 |

FOREIGN PATENT DOCUMENTS

| | | |
|---|---|---|
| 1300307 | 5/1992 | Canada . |
| 0044274 | 4/1981 | European Pat. Off. . |
| 0035969 | 9/1981 | European Pat. Off. . |
| 0054509 | 6/1982 | European Pat. Off. . |
| 0094915 | 11/1983 | European Pat. Off. . |
| 0126712 | 11/1984 | European Pat. Off. . |
| 0153904 | 9/1985 | European Pat. Off. . |
| 0223587 | 5/1987 | European Pat. Off. . |
| 0360869 | 4/1990 | European Pat. Off. . |
| 9318437 | 9/1993 | WIPO . |

OTHER PUBLICATIONS

Derwent Abst. 95–001969 [01] Oct. 1994.
Derwent Abst. 89–312247 [43] Sep. 1989.
Ullmanns Encyclopädie Der Technischen Chemie 4th Ed. vol. 13, Verlag Chemie, Weinheim 1977 p. 279ff.
Ullmanns Encyclopädie of Industrial Chemistry 5th Ed. vol. 14, Verlag Chemie, Weinheim 1989 p. 393ff.

Primary Examiner—Susan W. Berman
Attorney, Agent, or Firm—David R. Crichton

[57] ABSTRACT

The invention relates to a process for stabilizing a liquid radiation-curable composition comprising a cationically polymerizable compound and a photoinitiator for cationic polymerization against premature commencement of the polymerization, in which a basic ion exchanger is brought into contact with the composition, at least for a certain time. The ion exchanger is preferably removed before commencement of the radiation curing, at least from the part of the radiation-sensitive composition which comes into contact with the radiation. The process is particularly suitable for stabilizing stereolithography baths in extended use against an undesired increase in viscosity.

7 Claims, No Drawings

STABILIZATION OF LIQUID RADIATION-CURABLE COMPOSITIONS AGAINST UNDESIRED PREMATURE POLYMERIZATION

The present invention relates to a process for the stabilization of a liquid radiation-curable composition based on a cationically polymerizable compound and a photoinitiator for cationic polymerization against premature commencement of this polymerization, to a corresponding stabilized composition, and to a process for the production of three-dimensional articles by stereolithography in which said stabilization is used.

Liquid radiation-curable compositions comprising a cationically polymerizable compound and a photoinitiator for cationic polymerization are widespread in industry and are used, for example, as radiation-curable paints, photoresists or for the production of three-dimensional articles by stereolithography. The photoinitiator for the cationic polymerization is formed in these compositions by a strong latent acid, i.e. a compound which undergoes a photoreaction on irradiation to form a strong acid, which then initiates the cationic polymerization.

However, complications frequently occur when said radiation-curable compositions are used in practice, since the cationic polymerization commences prematurely, i.e. even before irradiation. This is generally due to premature formation of acids in the compositions. The undesired formation of acid can be due, for example, to decomposition of the photoinitiator, for example owing to moisture, heat, unintentional exposure to light or scattered light, or by unintentional entrainment of acid, and frequently results in such a large increase in the viscosity of the compositions that the latter become unuseable.

A stability problem of this type occurs, in particular, in the conventional production of three-dimensional articles by stereolithography using compositions based on a cationically polymerizable compound and a photoinitiator for cationic polymerization. In a stereolithographic process, as described in greater detail, for example, in U.S. Pat. No. 4,575,330, the three-dimensional articles are built up in layers from the liquid radiation-curable composition by first irradiating a layer of the composition imagewise, i.e. either over the entire area or in a predetermined pattern (with linear or vectorial scanning), using a UV/VIS light source, until the layer has solidified in a desired layer thickness in the irradiated areas. A new layer of the liquid radiation-curable composition is then formed on the layer which has already solidified and is likewise irradiated over the entire area or in a predetermined pattern, forming a second solidified layer adhering to the first. This operation is continued so that repeated covering of the material which has already solidified with further curable composition and imagewise irradiation of this liquid layer finally gives an article in the desired shape, also known as the "green part", which is still not fully cured, but has sufficiently solidified; the green part can be removed from the bath containing the liquid composition and finally cured in a different way, by heat and/or further irradiation. After removal of the preform, the stereolithography bath is, if necessary replenished with fresh curable composition and used for the production of a further green part. It has now been found that the cationically curable stereolithography baths, which, for economic reasons, are usually only replenished, have an unsatisfactory life and, after only a relatively short time, exhibit an increase in viscosity which can no longer be tolerated, in particular since stereolithography is used precisely for the production of articles having complex shapes, for example shapes with narrow gaps, corners or internal cavities only connected to the outside via a very small hole, from which high-viscosity material can no longer flow out to a sufficient extent.

EP-A-0 126 712 has already described increasing the shelf life of a radiation-curable composition based on a cationically polymerizable compound and a photoinitiator for cationic polymerization by adding small amounts of a weak organic base, for example a nitrile, amide, lactone or urea derivative. However, stabilizers of this type can only be employed to an unsatisfactory extent if they are not greatly to reduce the photosensitivity of the compositions.

The present invention relates to a process for stabilizing a liquid radiation-curable composition comprising a cationically polymerizable compound and a photoinitiator for cationic polymerization against premature commencement of polymerization, in which a basic ion exchanger is brought into contact with the composition, at least for a certain time.

The novel process binds the undesired acid particles in the liquid composition and at the same time avoids the disadvantages of the stabilizers of the prior art, since it does not use any low-molecular-weight stabilizer bases which dissolve in the radiation-sensitive composition or are permanently miscible therewith, but instead uses insoluble stabilizers in the form of solid basic ion exchanger materials. Even if the basic ion exchanger were to remain, during the irradiation, in the region of the radiation-curable composition which comes into contact with the radiation, a reduction in the photosensitivity is restricted to the immediate vicinity of the ion exchanger particles and is thus unimportant as far as curing of the composition as a whole is concerned.

However, the use of the solid basic ion exchanger also enables the contact of the curable composition with the basic stabilizer to be separated in space or time from the irradiation of the composition. It is therefore preferred in the abovementioned process to remove the ion exchanger before commencement of the radiation curing, at least from the part of the radiation-sensitive composition which comes into contact with the radiation, i.e. into which the radiation penetrates.

Basic ion exchangers have been known to the person skilled in the art for some time and are described in detail, for example, in Ullmanns Encyclopädie der Technischen Chemie, 4th Edn., Verlag Chemie, Weinheim 1977, Vol. 13, pp. 279 ff or in Ullmann's Encyclopaedia of Industrial Chemistry, 5th Ed., Verlag Chemie, Weinheim 1989, Vol. 14, page 393ff. They are also commercially available in a variety of forms. For the present invention preference is given to organic basic ion exchangers, i.e. polymers containing basic groups. A distinction is made in the art between highly basic and weakly basic ion exchangers. Highly basic organic ion exchangers are, for example, crosslinked copolymers of styrene, divinylbenzene and trimethyl (styrylmethyl)ammonium hydroxide or dimethyl(2-hydroxyethyl)styrylmethylammonium hydroxide.

For the purposes of the present invention, particular preference is given to weakly basic organic ion exchangers, especially crosslinked copolymers of styrene, divinylbenzene and dimethylaminomethylstyrene.

Basic ion exchangers, in particular the commercially available types, frequently still contain water and soluble basic impurities. Although it is possible to use the ion exchangers in this form, soluble basic impurities are preferably removed from the ion exchanger material before the exchanger is brought into contact with the liquid radiation-curable composition. This is accomplished, for example, by washing the ion exchanger material, preferably a number of times, with polar organic solvents, for example ethanol or ethyl acetate, and carefully drying it before it is used and brought into contact with the the liquid radiation-curable composition. If washed ion exchangers are used, the viscosity of the curable composition remains low and its photosensitivity particularly high for a particularly long time.

Commercial ion exchangers are generally supplied in the form of granules. However, it is also conceivable to carry out the novel process using ion exchanger material in other use forms having a high specific surface area, for example in the form of films or rods or alternatively in the form of pipes or tubes through which the radiation-curable composition could, for example, also be pumped.

The abovementioned separation of the contact of the curable composition with the basic ion exchanger from the irradiation of the composition in space or time can be accomplished, for example, by completely separating the ion exchanger from the curable composition before the exposure, for example by filtration, by sedimentation or by another suitable method for separating liquids and solids. The outlined procedure has general applicability and is suitable, in particular, for stabilizing radiation-curable coating materials, such as paints or photoresist compositions. The basic ion exchanger is added to the radiation-curable composition, for example at the end of the preparation process, for example during packaging in drums, and remains in direct contact with the composition, for example by mechanical fixing in the transport container, until used, i.e. in particular during transport and storage. Although the ion exchanger material, as mentioned above, can also remain in the composition, it is preferably separated off before the irradiation, preferably as late as possible before the irradiation, in particular directly before application of the curable composition, for example application of a corresponding coating material to a substrate. The present invention therefore also relates to a liquid radiation-curable composition comprising a cationically polymerizable compound, a photoinitiator for cationic polymerization and a basic, in particular weakly basic, organic ion exchanger in an amount sufficient to stabilize the composition against premature polymerization.

In another embodiment of the novel process, the basic ion exchanger is, while it is in contact with the curable composition, in a container which is totally impermeable to the ion exchanger, but is permeable to the curable composition, at least in one area. The container can be, for example, a cartridge having at least one, preferably two, in particular opposite, porous walls, the diameter of the pores being so low that the ion exchanger material cannot leak out of the container. This procedure allows the end user to separate the ion exchanger and curable composition particularly simply.

The requisite amount of ion exchanger depends on the capacity of the exchanger and on the intensity and duration of its contact with the radiation-curable liquid. The amount can be determined by the person skilled in the art by means of a few simple routine experiments. The ion exchanger is preferably used in such an amount that its total useful capacity is equivalent to from 5 to 80 per cent, preferably 5 to 50 per cent, of the amount of acid that can be formed by all the initiator for the cationic polymerization which is present in the radiation-curable composition.

The liquid radiation-curable compositions for which the novel stabilization process is suitable can contain any conventional cationically polymerizable organic compounds, either alone or in the form of a mixture with at least one further compound which can be polymerized cationically or by another mechanism, for example by means of free radicals. These include, for example, ethylenically unsaturated compounds which can be polymerized by a cationic mechanism, such as monoolefins and diolefins, for example isobutylene, butadiene, isoprene, styrene, α-methylstyrene, divinylbenzenes, N-vinylpyrrolidone, N-vinylcarbazole and acrolein, or vinyl ethers, for example methyl vinyl ether, isobutyl vinyl ether, trimethylolpropane trivinyl ether, ethylene glycol divinyl ether; cyclic vinyl ethers, for example 3,4-dihydro-2-formyl-2H-pyran (dimeric acrolein) and the 3,4-dihydro-2H-pyran-2-carboxylic ester of 2-hydroxymethyl-3,4-dihydro-2H-pyran, and vinyl esters, for example vinyl acetate and vinyl stearate. They can also be cationically polymerizable heterocyclic compounds, for example ethylene oxide, propylene oxide, epichlorohydrin, glycidyl ethers or monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes, such as 3,3-dimethyloxetane and 3,3-di(chloromethyl)oxetane; tetrahydrofuran; dioxolanes, trioxane and 1,3,6-trioxacyclooctane; lactones, such as β-propiolactone, γ-valerolactone and ε-caprolactone; spiroether carbonates spiroether esters; thiiranes, such as ethylene sulfide and propylene sulfide; epoxy resins; linear and branched polymers containing glycidyl groups in the side chains, for example homopolymers and copolymers of polyacrylate and polymethacrylate glycidyl esters. Other suitable cationically polymerizable compounds are methylol compounds, which include amino resins, for example the N-hydroxymethyl-, N-methoxymethyl-, N-n-butoxymethyl- and N-acetoxymethyl derivatives of amides or amide-like compounds, for example cyclic ureas, such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), 1,3,5-melamine and further polytriazines, such as acetoguanamine, benzoguanamine and adipoguanamine. If desired, use can also be made of amino resins containing both N-hydroxymethyl and N-acetoxymethyl groups, for example hexamethylolmelamin, in which 1 to 3 of the hydroxyl groups have been etherified by means of methyl groups. Other suitable methylol compounds are phenolic resins, in particular resols prepared from a phenol and an aldehyde. The phenols which are suitable for this purpose include phenol itself, resorcinol, 2,2-bis(p-hydroxyphenyl)propane, p-chlorophenol, a phenol which is substituted by one or two alkyl groups each having 1 to 9 carbon atoms, such as o-, m- or p-cresol, the xylenols, p-tert-butylphenol and p-nonylphenol, and also phenyl-substituted phenols, in particular p-phenylphenol. The aldehyde condensed with the phenol is preferably formaldehyde, but other aldehydes, such as acetaldehyde and furfural, are also suitable. If desired, a mixture of such curable phenol-aldehyde resins can be used.

Particularly important cationically polymerizable compounds are epoxy resins having on average more than one 1,2-epoxide group in the molecule. Such resins can have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available. The following may be mentioned by way of examples of epoxy resins of this type:

I) Polyglycidyl and poly(β-methylglycidyl) esters obtainable by reacting a compound containing at least two carboxyl groups in the molecule and epichlorohydrin or glycerol dichlorohydrin or β-methylepichlorohydrin. The reaction is expediently carried out in the presence of bases. The compounds containing at least two carboxyl groups in the molecule can be, for example, aliphatic polycarboxylic acids. Examples of these polycarboxylic acids are glutaric acid, adipic acid, pimelic acid, suberic acid, azelaic acid, sebacic acid or dimerized or trimerized linoleic acid. However, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids, for example phthalic acid, isophthalic acid, trimellitic acid or pyromellitic acid. Use can also be made of carboxyl-terminated adducts, for example of trimellitic acid and polyols, for example glycerol or 2,2-bis(4-hydroxycyclohexyl)propane.

II) Polyglycidyl or poly(β-methylglycidyl) ethers obtainable by reacting a compound containing at least two free alcoholic hydroxyl groups and/or phenolic hydroxyl groups and a suitably substituted epichlorohydrin under alkaline conditions, or in the presence of an acidic catalyst followed by treatment with alkali. Ethers of this type are derived, for example, from acyclic alcohols, such as ethylene glycol, diethylene glycol and higher poly(oxyethylene)glycols, propane-1,2-diol, or poly(oxypropylene)glycols, propane-1, 3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. However, the ethers can also be derived from cycloaliphatic alcohols, such as 1,3- or 1,4-dihydroxycyclohexane, bis(4-hydroxycyclohexyl)methane, 2,2-bis(4-hydroxycyclohexyl) propane or 1,1-bis-(hydroxymethyl)cyclohex-3-ene, or they contain aromatic rings, such as N,N-bis-(2-hydroxyethyl) aniline or p,p'-bis(2-hydroxyethylamino)diphenylmethane. Glycidyl ethers can also be derived from monocyclic phenols, for example from resorcinol or hydroquinone, or they can be based on polycyclic phenols, for example on bis(4-hydroxyphenyl)methane (bisphenol F), 2,2-bis-(4-hydroxyphenyl)propane (bisphenol A), or condensation products, obtained under acidic conditions, of phenols or cresols with formaldehyde, such as phenol-novolaks and cresol-novolaks.

III) Poly-(N-glycidyl) compounds are obtainable, for example, by dehydrochlorination of the products of the reaction of epichlorohydrin with amines containing at least two amine hydrogen atoms. These amines are, for example, n-butylamine, aniline, toluidine, m-xylylenediamine, bis(4-aminophenyl)methane or bis(4-methylaminophenyl) methane. However, the poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

IV) Examples of suitable poly(S-glycidyl) compounds are di-S-glycidyl derivatives derived from dithiols, for example ethane-1,2-dithiol or bis(4-mercaptomethylphenyl) ether.

V) Examples of epoxide compounds in which the epoxide groups form part of an alicyclic or heterocyclic ring system are, for example, bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methanediglycidyl ether, 2,2-bis(4-hydroxycyclohexyl) propanediglycidyl ether, 3,4-epoxycyclohexylmethyl 3,4-epoxycyclohexanecarboxylate, 3,4-epoxy-6-methylcyclohexylmethyl 3,4-epoxy-6-methylcyclohexanecarboxylate, di(3,4-epoxycyclohexylmethyl)hexanedioate, di(3,4-epoxy-6-methylcyclohexylmethyl) hexanedioate, ethylenebis-(3,4-epoxycyclohexanecarboxylate), ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

However, it is also possible to use epoxy resins in which the 1,2-epoxide groups are bonded to different heteroatoms or functional groups. These compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane. Also suitable are liquid prereacted adducts of such epoxy resins with curing agents for epoxy resins.

The photoinitiators for cationic polymerization can likewise be all compounds known for this purpose in the art. These include, for example, onium salts with anions of low nucleophilicity. Examples thereof are halonium salts, iodosyl salts or sulfonium salts, as described in EP-A 153 904, sulfoxonium salts, as described, for example, in EP-A 35 969, 44 274, 54 509 and 164 314, or diazonium salts, as described, for example, in U.S. Pat. No. 3,708,296. Further cationic photoinitiators are metallocene salts, as described, for example, in EP-A 94 914 and 94 915. A review of further common onium salt initiators and/or metallocene salts is given in "UV-Curing, Science and Technology". (Editor: S. P. Pappas, Technology Marketing Corp., 642 Westover Road, Stanford, Conn., USA) or "Chemistry & Technology of UV & EB Formulations for Coatings, Inks and Paints", Vol. 3 (edited by P. K. T. Oldring).

Particularly suitable photoinitiators for the cationic polymerization are compounds of the formulae (1), (2) and (3)

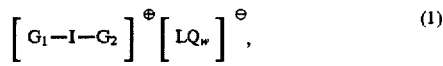

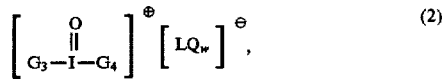

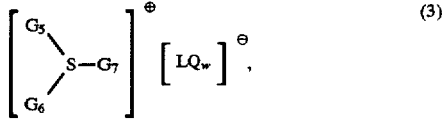

in which $G_1$, $G_2$, $G_3$, $G_4$, $G_5$, $G_6$ and $G_7$, are $C_6$–$C_{18}$aryl which is unsubstituted or substituted by suitable radicals, L is boron, phosphorus, arsenic or antimony, Q is a halogen atom or a part of the radicals Q in an anion $LQ_w^-$ can also be a hydroxyl group, and w is an integer corresponding to the valency of L plus 1. Examples of $C_6$–$C_{18}$aryl here are phenyl, naphthyl, anthryl and phenanthryl. Substituents which may be present on suitable radicals are alkyl, preferably $C_1$–$C_6$alkyl, such as methyl, ethyl, n-propyl, isopropyl, n-butyl, sec-butyl, isobutyl, tert-butyl and the various pentyl and hexyl isomers, alkoxy, preferably $C_1$–$C_6$alkoxy, such as methoxy, ethoxy, propoxy, butoxy, pentoxy and hexoxy, alkylthio, preferably $C_1$–$C_6$alkylthio, such as methylthio, ethylthio, propylthio, butylthio, pentylthio and hexylthio, halogen, such as fluorine, chlorine, bromine and iodine, amino groups, cyano groups, nitro groups and arylthio, such as phenylthio. Examples of particularly advantageous halogen atoms Q are chlorine and in particular fluorine, examples of anions $LQ_w^-$ are, in particular, $BF_4^-$, $PF_6^-$, $AsF_6^-$, $SbF_6^-$ and $SbF_5(OH)^-$. The anion of the type $LQ_w^-$ can also advantageously be replaced by $CF_3SO_3^-$. Compounds containing two or more onium groups in the molecule, for example disulfonium compounds, are of course also suitable as initiators. Particularly frequent use is made of cationic photoinitiators of the formula (3) in which $G_5$, $G_6$ and $G_7$ are phenyl or biphenyl, or mixtures of these two compounds.

A further important type of cationic photoinitiators has the formula (4)

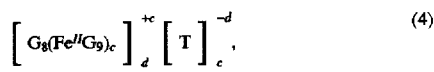

(4)

in which c is 1 or 2, d is 1, 2, 3, 4 or 5, T is a non-nucleophilic anion, for example $BF_4^-$, $PF_6^-$, $AsF_6^-$, $SbF_6^-$, $CF_3SO_3^-$, $C_2F_5SO_3^-$, $n-C_3F_7SO_3^-$, $n-C_4F_9SO_3^-$, $n-C_6F_{13}SO_3^-$, $n-C_8F_{17}SO_3^-$, $C_6F_5SO_3^-$, phosphorus tungstate $(PO_{40}W_{12}^{3-})$ or silicon tungstate $(SiO_{40}W_{12}^{4-})$, $G_8$ is a π-arene, and $G_9$ is an anion of a π-arene, in particular a cyclopentadienyl anion. Examples of π-arenes $G_8$ and anions of π-arenes $G_9$ which are suitable here are given in EP-A 94 915. Important π-arenes $G_8$ are toluene, xylene, ethylbenzene, cumene, methoxybenzene, methylnaphthalene, pyrene, perylene, stilbene, diphenylene oxide and diphenylene sulfide. Particular preference is given to cumene, methylnaphthalene and stilbene. The anion T is in particular $PF_6^-$, $AsF_6^-$, $SbF_6^-$, $CF_3SO_3^-$, $C_2F_5SO_3^-$, $n-C_3F_7SO_3^-$, $n-C_4F_9SO_3^-$, $n-C_6F_{13}SO_3^-$ or $n-C_8F_{17}SO_3^-$. The ferrocene salts, like metallocene salts, can generally also be employed in combination with oxidants. Such combinations are described in EP-A 126 712.

The cationic photoinitiators can of course be added in the conventional effective amounts, for example in each case in amounts of from about 0.1 to 20 per cent by weight, preferably from 1 to 10 per cent by weight, based on the total amount of the mixture. In order to increase the light yield, sensitizers can also be employed, depending on the initiator type. Examples thereof are polycyclic aromatic hydrocarbons and aromatic keto compounds. Specific examples of preferred sensitizers are mentioned in EP-A 153 904.

The liquid, radiation-curable compositions can also comprise further constituents usually employed in the art of photopolymerizable materials, for example inert solvents suitable for the particular components, or conventional additives, such as stabilizers, for example UV stabilizers, release agents, wetting agents, flow-control agents, antisettling agents, surfactants, dyes, pigments or fillers. The additives are employed in each case in the effective amount for the desired purpose and can make up a total of, for example, up to 20 per cent by weight of the novel compositions.

The novel stabilization process is particularly suitable for use in stereolithography. The present invention therefore also relates to a process for the production of three-dimensional articles by stereolithography using a liquid radiation-curable composition comprising a cationically polymerizable compound and a photoinitiator for cationic polymerization, in which a basic ion exchanger is brought into contact with the composition and is removed, at least from commencement of the radiation-curing onwards, from the part of the radiation-sensitive composition which comes into contact with the radiation.

In said stereolithography process, the ion exchanger is preferably in a container, as outlined above, which is totally impermeable to the ion exchanger, but is permeable to the curable composition, at least in one area. This container is introduced into the stereolithography bath, at least for a certain time.

It is furthermore preferred to generate a relative movement between the liquid composition in the stereolithography bath and the container while the container is in the bath, so that the most intensive contact possible between the ion exchanger and the entire bath material is possible.

Liquid curable compositions which are particularly suitable for stereolithography in this case are based, in particular, on liquid epoxy resins as cationically curable compounds, for example the epoxy resins mentioned above. These are particularly preferably so-called hybrid systems, i.e. compositions which contain at least one compound which can be cured by means of free radicals and a free-radical polymerization photoinitiator which is suitable therefor, as well as the cationically curable components. Such hybrid systems are described, for example, in EP-A-0 360 869 and EP-A-0 605 361, whose description should be regarded as part of this description.

The compounds which can be polymerized by means of free radicals can be used, for example, in amounts of from 0 to 80 per cent by weight, based on the total composition. For example, the composition can comprise from 5 to 30 per cent by weight of components which can be cured by means of free radicals and from 70 to 95 per cent by weight of cationically curable components. The compounds which can be polymerized by means of free radicals are frequently monoacrylates, diacrylates and polyacrylates having an acrylate functionality of up to 9 or corresponding methacrylates, or vinyl compounds having a vinyl functionality of up to 6.

Examples of suitable mono(meth)acrylates are acrylate, allyl methacrylate, methyl, ethyl, n-propyl, n-butyl, isobutyl, n-hexyl, 2-ethylhexyl, n-octyl, n-decyl and n-dodecyl acrylate and methacrylate, 2-hydroxyethyl, 2- and 3-hydroxypropyl acrylate and methacrylate, 2-methoxyethyl, 2-ethoxyethyl and 2- or 3-ethoxypropyl acrylate, tetrahydrofurfuryl methacrylate, 2-(2-ethoxyethoxy)ethyl acrylate, cyclohexyl methacrylate, 2-phenoxyethyl acrylate, glycidyl acrylate and isodecyl acrylate, and examples of suitable mono-N-vinyl compounds are n-vinylpyrrolidone and N-vinylcaprolactam. Such products are also known and some are commercially available, for example from the SARTOMER Company.

Examples of suitable additional di(meth)acrylates are the di(meth)acrylates of cycloaliphatic or aromatic diols, such as 1,4-dihydroxymethylcyclohexane, 2,2-bis(4-hydroxycyclohexyl)propane, bis(4-hydroxycyclohexyl) methane, hydroquinone, 4,4'-dihydroxybiphenyl, bisphenol A, bisphenol F, bisphenol S, ethoxylated or propoxylated bisphenol A, ethoxylated or propoxylated bisphenol F or ethoxylated or propoxylated bisphenol S. Such di(meth) acrylates are known, and some are commercially available.

The di(meth)acrylates can also be compounds of the formula (5), (6), (7) or (8)

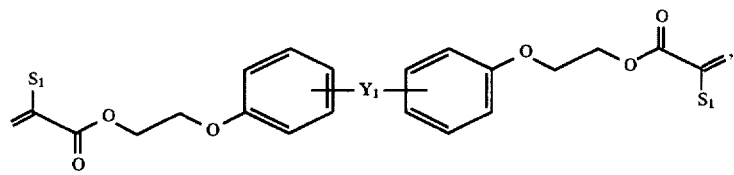
(5)

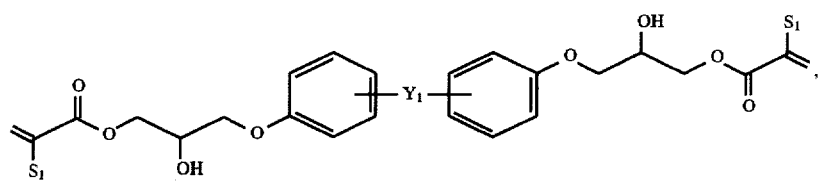
(6)

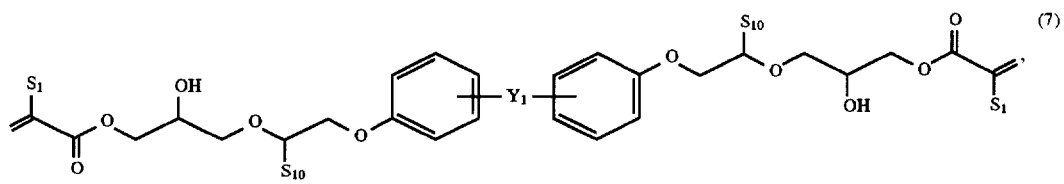
(7)

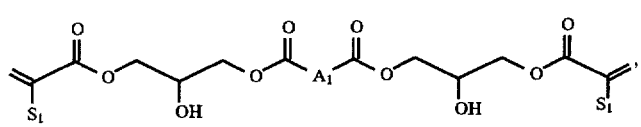
(8)

in which $S_1$ is a hydrogen atom or methyl, $Y_1$ is a direct bond, $C_1$–$C_6$alkylene, —S—, —O—, —SO—, —SO$_2$— or —CO—, $S_{10}$ is a $C_1$–$C_8$alkyl group, a phenyl group which is unsubstituted or substituted by one or more $C_1$–$C_4$alkyl groups, hydroxyl groups or halogen atoms, or a radical of the formula —CH$_2$—OS$_{11}$, in which $S_{11}$ is a $C_1$–$C_8$alkyl group or a phenyl group, and $A_1$ is a radical selected from the radicals of the formulae

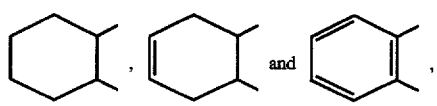

The di(meth)acrylates of the formulae (5) and (6) are known, and some are commercially available, for example under the name SR®349 and Novacure®3700, and can be prepared by reacting ethoxylated bisphenols, in particular ethoxylated bisphenol A, or bisphenol diglycidyl ethers, in particular bisphenol A diglycidyl ether, with (meth)acrylic acid.

In the same way, compounds of the formulae (7) and (8) can be prepared by reacting a diglycidyl ether of the formula (7a)

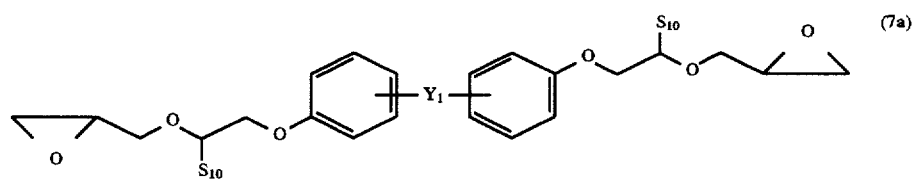
(7a)

or a diglycidyl ester of the formula (8a)

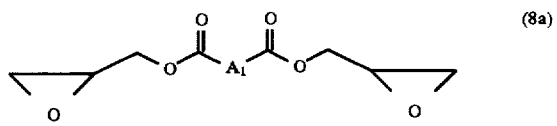
(8a)

where $S_{10}$, $Y_1$ and $A_1$ are as defined above, with (meth)acrylic acid.

The diacrylates can furthermore be a compound of the formula (9), (10), (11) or (12)

In the novel compositions, the further compounds which can be polymerized by means of free radicals can also be

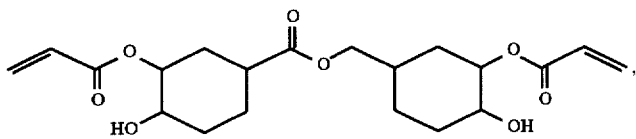 (9)

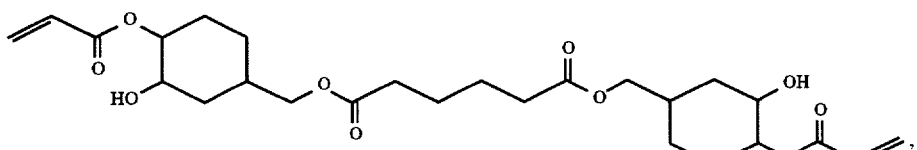 (10)

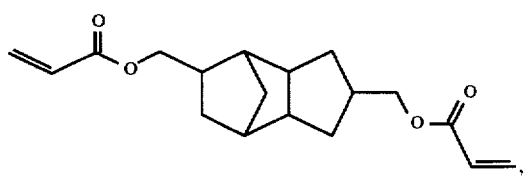 (11)

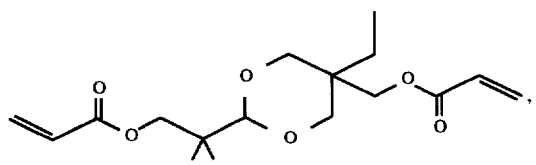 (12)

These compounds are known, and some are commercially available. The compounds of the formulae (9) and (10) can be prepared in a known manner by reacting the cycloaliphatic diepoxides of the formula (9a) or (10a)

hexafunctional or polyfunctional urethane acrylates or urethane methacrylates. These urethane (meth)acrylates are known to the person skilled in the art and can be prepared in a known manner, for example by reacting a hydroxy-

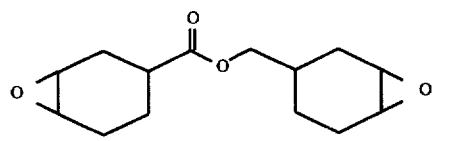 (9a)

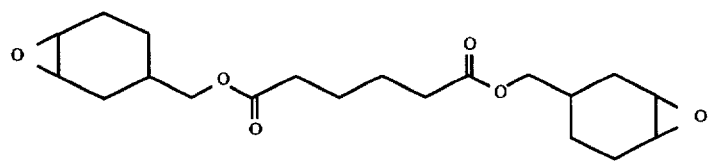 (10a)

respectively with (meth)acrylic acid. The compound of the formula (12) is commercially available under the name Kayarad®R-604.

Examples of suitable additional poly(meth)acrylates are monomeric or oligomeric aliphatic, cycloaliphatic or aromatic acrylates or methacrylates having a (meth)acrylate functionality of greater than 2, in particular tri-, tetra- or pentafunctional acrylates or methacrylates.

Examples of suitable aliphatic polyfunctional (meth) acrylates are the triacrylates and trimethacrylates of hexane-2,4,6-triol, glycerol or 1,1,1-trirethylolpropane, ethoxylated or propoxylated glycerol or 1,1,1-trimethylolpropane, and the hydroxyl-containing tri(meth)acrylates obtained by reacting triepoxide compounds, for example the triglycidyl ether of said triols, with (meth)acrylic acid. It is also possible to use, for example, pentaerythritol tetraacrylate, bistrimethylolpropane tetraacrylate, pentaerythritol monohydroxytriacrylate or -methacrylate or dipentaerythritol monohydroxypentaacrylate or -methacrylate.

terminated polyurethane with acrylic acid or methacrylic acid or by reacting an isocyanate-terminated prepolymer with hydroxyalkyl (meth)acrylates.

Examples of suitable tri(meth)acrylates are the products of the reaction of triglycidyl ethers of trihydric phenols and phenol- or cresol-novolaks containing three hydroxyl groups with (meth)acrylic acid.

The novel compositions preferably comprise at least one (meth)acrylate having an acrylate functionality of from 1 to 9 which is soluble in the composition; they particularly preferably comprise a liquid mixture of aromatic, aliphatic or cycloaliphatic (meth)acrylates having an acrylate functionality of from 2 to 9.

Other suitable photoinitiators for free-radical polymerization are all compound types which form free radicals on appropriate irradiation. Typical compounds of known photoinitiators are benzoins, such as benzoin, benzoin ethers, such as benzoin methyl ether, benzoin ethyl ether, benzoin isopropyl ether and benzoin phenyl ether, and benzoin acetate, acetophenones, such as acetophenone, 2,2-dimethoxyacetophenone and 1,1-dichloroacetophenone, benzil, benzil ketals, such as benzil dimethyl ketal and benzil diethyl ketal, anthraquinones, such as 2-methylanthraquinone, 2-ethylanthraquinone, 2-tert-butylanthraquinone, 1-chloroanthraquinone and 2-amylanthraquinone, furthermore triphenylphosphine, benzoylphosphine oxides, for example 2,4,6-trimethylbenzoyldiphenylphosphine oxide (Luzirin TPO), benzophenones, such as benzophenone and 4,4'-bis-(N,N'-dimethylamino)benzophenone, thioxanthones and xanthones, acridine derivatives, phenazine derivatives, quinoxaline derivatives and 1-phenyl-1,2-propanedione 2-O-benzoyl oxime, 1-aminophenyl ketones and 1-hydroxyphenyl ketones, such as 1-hydroxycyclohexyl phenyl ketone, phenyl 1-hydroxyisopropyl keton and 4-isopropylphenyl 1-hydroxyisopropyl ketone, all of which are known compounds.

Particularly suitable photoinitiators, which are usually used in combination with an He/Cd laser as light source, are acetophenones, such as 2,2-dialkoxybenzophenones and 1-hydroxyphenyl ketones, for example 1-hydroxycyclohexyl phenyl ketone and 2-hydroxyisopropyl phenyl ketone (=2-hydroxy-2,2-dimethylacetophenone), in particular 1-hydroxycyclohexyl phenyl ketone.

Another class of free-radical photoinitiators usually employed when argon ion lasers are used are benzil ketals, for example benzil dimethyl ketal. The photoinitiator is in particular an α-hydroxyphenyl ketone, benzil dimethyl ketal or 2,4,6-trimethylbenzoyldiphenylphosphine oxid.

Another class of suitable free-radical photoinitiators comprises the ionic dye counterion compounds, which are capable of absorbing actinic radiation and generating free radicals which initiate the polymerization of substances such as (meth)acrylates or vinyl compounds. The novel mixtures comprising ionic dye-counterion compounds can be cured variably in this way using visible light in the adjustable wavelength range from 400 to 700 nm. Ionic dye-counterion compounds and their mode of action are known, for example from EP-A-O 223 587 and U.S. Pat. Nos. 4,751,102; 4,772,530 and 4,772,541. Examples which may be mentioned of suitable ionic dye-counterion compounds are the anionic dye-iodonium ion complexes, the anionic dye-pyryllium ion complexes and in particular the cationic dye-borate anion compounds of the formula

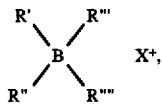

in which $X^+$ is a cationic dye, and R', R", R'" and R"", independently of one another, are each an alkyl, aryl, alkaryl, allyl, aralkyl, alkenyl, alkynyl, alicyclic or saturated or unsaturated heterocyclic group.

It is known to the person skilled in the art that suitable photoinitiators must be selected for each chosen light source or, if appropriate, sensitized thereto. It has been recognized that the depth of penetration of the radiation into the composition to be polymerized and the working rate are in direct correlation with the absorption coefficient and the concentration of the photoinitiator. In stereolithography, preference is given to photoinitiators which cause the maximum number of free radicals or cationic particles to be formed for a certain laser energy, so that a preform of optimum strength is formed at the set curing depth. Both cationic and free-radical photoinitiators are added to the stereolithography mixtures in effective amounts, in particular in each case in amounts of from about 0.1 to about 10 per cent by weight, based on the total weight of the mixture, it being essential, in particular, when lasers are used for the radiation curing, that the absorption ability of the mixtures is adjusted through the type and concentration of the photoinitiator so that the curing depth for normal laser speed is from about 0.1 to 2.5 mm. The total amount of photoinitiators in the novel compositions is preferably from 0.5 to 5 per cent by weight.

It is of course also possible for the usual additives in this technology to be present in the stereolithography baths for the present invention. These are, for example, the above-mentioned additives or additional crosslinking agents, such as diols or polyols.

Apart from the novel stabilization, the stereolithography process can of course be carried out in any conventional manner, for example as described in U.S. Pat. No. 4,575,330 or in EP-A-0 605 361.

EXAMPLE 1

200 g of a wet, weakly basic ion exchanger (AMBERLYST®A21 from Rohm & Haas) are washed with 3×300 millilitres of anhydrous ethanol and with 3×300 millilitres of ethyl acetate, the exchanger material being sucked dry after each wash. The ion exchanger resin washed in this way is finally dried overnight at 60° C. under a pressure of 0.1 hPa.

100 g of CIBATOOL™SL 5180, a commercially available composition for stereolithography based on epoxy resins as cationically polymerizable compounds and a sulfonium salt of the formula

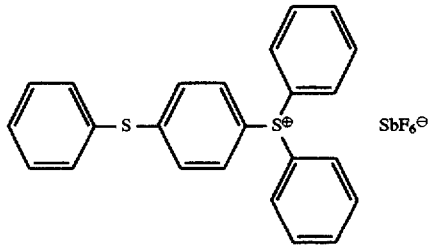

as photoinitiator for cationic polymerization, and further constituents which can be polymerized by means of free radicals (hybrid system) are introduced into a brown glass bottle together with 1 g of the above ion exchanger, and the mixture is subjected to an accelerated ageing test for 24 hours in a convection oven at 80° C. The viscosity of the composition (determined at 30° C. using a Brookfield viscometer with a No. 21 spindle) is 180 mPa.s, precisely as before the heating. By contrast, if no ion exchanger is added to the composition, the viscosity of the resin after storage for 24 hours in an oven at 80° C. is 190 mPa.s (likewise determined at 30° C. using a Brookfield viscometer with No. 21 spindle).

The photosensitivity is determined using the so-called "window-pane method", described by Dr. Paul F. Jakobs, "RAPID PROTOTYPING & MANUFACTURING, FUNDAMENTALS OF STEREOLITHOGRAPHY", published by SME, Dearborn, Mich. USA, pages 263–277, using an Ar/UV laser with 351 nm radiation at 20 mW. For the composition with ion exchanger, a radiation penetration depth $D_p$ of about 0.17 mm and a critical energy $E_c$ of 22.3 mJ/cm³ are found after storage for 24 hours at 80° C., i.e. values comparable to those for the fresh solution (radiation penetration depth about 0.17 mm and critical energy 23.3 mJ/cm³).

EXAMPLE 2

10 preforms in the QUICKLAST™ design and measuring 80×4×4 mm are produced by stereolithography from a bath containing a total of 100 g of CIBATOOL™SL 5180 as described in "RAPID PROTOTYPING SYSTEMS: FAST TRACK TO PRODUCT REALIZATION", SME, Dearborn, Mich. 48121, 1994, pages 68 ff. The strips are left in the bath for 7 days (test sample 1). Test sample 2 is freshly prepared CIBATOOL™SL 5180 and test sample 3 is freshly prepared CIBATOOL™SL 5180 containing 1 per cent by weight of the weakly basic ion exchanger AMBERLYST®A21 (unwashed). The samples are stored in the oven at 80° C. for 21 days, during which the viscosity is determined at 30° C. using a Brookfield viscometer with No. 21 spindle at intervals of a few days. The viscosities shown below are found.

| after storage for: | Viscosity [mPa · s] Sample 1 | Sample 2 | Sample 3 |
| --- | --- | --- | --- |
| 0 days | 156 | 156 | 156 |
| 5 days | — | — | 249 |
| 6 days | 10700 | 818 | — |
| 9 days | gelled | 1510 | 364 |
| 12 days |  | 3420 | 411 |
| 14 days |  | 6180 | — |
| 16 days |  | 12100 | 503 |
| 21 days |  | gelled | — |
| 24 days |  |  | 618 |

The example clearly shows that sample 1 has gelled after only 9 days. It is assumed that the acid diffuses out of the green part into the bath, and this diffusion of protons out of the green parts is responsible for the considerable increase in the viscosity in conventional unstabilized stereolithography baths. The fresh composition (sample 2) also exhibits a rapid increase in viscosity during storage, while sample 3 stabilized in accordance with the invention only shows a minimal increase in viscosity.

EXAMPLE 3

100 g of CIBATOOL™SL 5180 are introduced into a brown glass bottle together with 0.1 g of the washed ion exchanger from Example 1, and the mixture is subjected to an accelerated ageing test for 26 days in a convection oven at 80° C. The viscosity of the test sample (determined at 30° C. using a Brookfield viscometer with No. 21 spindle) is measured at intervals of a few days. The photosensitivity is determined at the same time by the window-pane method (conditions as in Example 1) using an Ar/UV laser. The following values are obtained:

| Storage time | Viscosity [mPa · s] | Radiation penetration [mm] | Critical energy [mJ/cm²] |
| --- | --- | --- | --- |
| 0 days | 156 | 0.18 | 23.9 |
| 11 days | 214 | 0.19 | 27.5 |
| 26 days | 260 | 0.18 | 28 |

EXAMPLE 4

69.2 g of 3,4-epoxycyclohexylmethyl 3,4-epoxycyclohexanecarboxylate, 27.2 g of TONE®0301 (product of the addition reaction between 1 mol of trimethylolpropane and 3 mol of caprolactone), 0.5 g of a photoinitiator of the formula

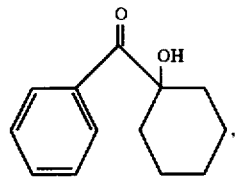

3 g of a photoinitiator of the formula

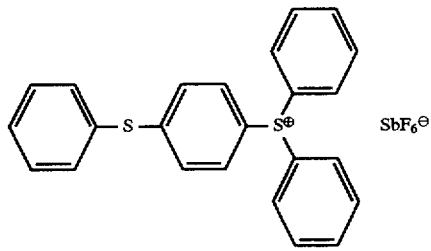

and 0.1 g of pyrene are mixed in a brown glass bottle, and the mixture is subjected to an accelerated ageing test for 20 days in an oven at 80° C. (test sample 1). 100 g of the same mixture are mixed with 0.1 g of washed ion exchanger of the AMBERLYST®A 21 type and subjected to the same test (test sample 2). The viscosities of the test samples (at 30° C. using a Brookfield viscometer, No. 21 spindle) are measured at intervals of a few days, giving the following values:

| Storage time | Test sample 1 Viscosity [mPa · s] | Test sample 2 Viscosity [mPa · s] |
| --- | --- | --- |
| 0 days | 336 | 336 |
| 10 days | 1290 | 459 |
| 13 days | 2020 | 508 |
| 20 days | 5460 | 660 |

What is claimed is:

1. In a process for the production of three-dimensional articles in a stereolithographic bath which process comprises the step of sequentially irradiating a plurality of layers of a liquid radiation-curable composition comprising a cationically polymerizable compound and a photoinitiator for cationic polymerization, the improvement of stabilizing said composition in said stereolithographic bath against a premature commencement of the polymerization associated with an unintended increase of the viscosity of the composition during the time period of its use comprising bringing a basic ion exchanger material into contact with said composition, for a time sufficient to effect said stabilization.

2. A process according to claim 1, in which the ion exchanger is removed before commencement of the radiation curing, at least from the part of the radiation-sensitive composition which comes into contact with the radiation.

3. A process according to claim 1, in which soluble basic impurities are removed from the ion exchanger material before the ion exchanger is brought into contact with the liquid radiation-curable composition.

4. A process according to claim 1, in which the ion exchanger is in a container which is introduced into the stereolithography bath, at least for a certain time, and which is totally impermeable to the ion exchanger, but is permeable to the curable composition, at least in one area.

5. A process according to claim 4, in which a relative movement takes place between the liquid composition in the stereolithography bath and the container while the container is in the bath.

6. A process according to claim 1, in which the cationically polymerizable compound in the liquid radiation-curable composition is at least one epoxy resin.

7. A process according to claim 6, in which the liquid radiation-curable composition also comprises at least a compound which can be cured by means of free radicals or a mixture of two or more of these compounds, and a photoinitiator for free-radical polymerization.

* * * * *

UNITED STATES PATENT AND TRADEMARK OFFICE
CERTIFICATE OF CORRECTION

PATENT NO. : 5,783,358
DATED : JULY 21, 1998
INVENTOR(S) : ADRIAN SCHULTHESS ET AL.

It is certified that error appears in the above-indentified patent and that said Letters Patent is hereby corrected as shown below:

Title page, left column, insert section

-- [30]     Foreign Application Priority Data

Mar. 13, 1995    [CH]    Switzerland ........................00717/95 --.

Signed and Sealed this

Twelfth Day of October, 1999

Attest:

Q. TODD DICKINSON

*Attesting Officer*      Acting Commissioner of Patents and Trademarks